United States Patent
Yeric et al.

(10) Patent No.: US 10,036,774 B2
(45) Date of Patent: Jul. 31, 2018

(54) INTEGRATED CIRCUIT DEVICE COMPRISING ENVIRONMENT-HARDENED DIE AND LESS-ENVIRONMENT-HARDENED DIE

(71) Applicant: ARM Limited, Cambridge (GB)

(72) Inventors: Gregory Munson Yeric, Austin, TX (US); Vikas Chandra, San Jose, CA (US)

(73) Assignee: ARM Limited, Cambridge (GB)

( * ) Notice: Subject to any disclaimer, the term of this patent is extended or adjusted under 35 U.S.C. 154(b) by 11 days.

(21) Appl. No.: 14/560,755

(22) Filed: Dec. 4, 2014

(65) Prior Publication Data
US 2016/0161550 A1 Jun. 9, 2016

(51) Int. Cl.
G01R 31/00 (2006.01)
G01R 31/28 (2006.01)
H01L 21/66 (2006.01)
H01L 25/065 (2006.01)

(52) U.S. Cl.
CPC ..... *G01R 31/2855* (2013.01); *G01R 31/2856* (2013.01); *H01L 22/30* (2013.01); *H01L 25/0657* (2013.01); *H01L 22/34* (2013.01); *H01L 2224/48091* (2013.01); *H01L 2224/48145* (2013.01); *H01L 2224/73204* (2013.01); *H01L 2225/06541* (2013.01); *H01L 2225/06589* (2013.01); *H01L 2225/06596* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 6,180,426 B1 | 1/2001 | Lin | |
| 6,438,722 B1 | 8/2002 | Bailey et al. | |
| 8,559,258 B1 * | 10/2013 | Stephens, Jr. | G11C 11/40615 365/211 |
| 8,782,479 B2 * | 7/2014 | Chakrabarty | G01R 31/318558 714/727 |
| 8,933,447 B1 * | 1/2015 | Rahman | G01B 31/318513 257/48 |
| 9,164,147 B2 * | 10/2015 | Chi | G01B 31/318513 |

(Continued)

OTHER PUBLICATIONS http://www.ridgetopgroup.com/wp-content/uploads/2015/06/WP_ITC-3D-TEST-Workshop-TSV-BIST-2-5D-3D-IC-Interconn-Integrity-Mon_copyrighted.pdf TSV BIST™: An Innovative Method for 2.5D/3D IC Interconnection Integrity Monitoring, 2013.*

(Continued)

*Primary Examiner* — Patrick Assouad
*Assistant Examiner* — Demetrius Pretlow
(74) *Attorney, Agent, or Firm* — Pramudji Law Group PLLC; Ari Pramudji

(57) ABSTRACT

An integrated circuit device has at least one environment-hardened die and at least one less-environment-hardened die. Environment-hardened circuitry on the environment-hardened die is more resistant to the degradation when exposed to a predetermined environmental condition than the less-environment-hardened circuitry on the environment-hardened die. The dice are combined using a 3D or 2.5D integrated circuit technology. This is very useful for testing circuits at adverse environmental conditions (e.g. high temperature), or for providing circuits to operate at such conditions.

19 Claims, 6 Drawing Sheets

(56) References Cited

U.S. PATENT DOCUMENTS

| | | | | |
|---|---|---|---|---|
| 9,692,476 B2* | 6/2017 | Gundel | ................ | H05K 1/0239 |
| 2006/0060955 A1* | 3/2006 | Kummerl | .............. | H01L 25/167 |
| | | | | 257/686 |
| 2007/0018199 A1* | 1/2007 | Sheppard | .......... | H01L 29/42316 |
| | | | | 257/200 |
| 2009/0036070 A1* | 2/2009 | Rofougaran | ........ | H01L 25/0657 |
| | | | | 455/126 |
| 2009/0114913 A1* | 5/2009 | Bernstein | .......... | H01L 21/76898 |
| | | | | 257/48 |
| 2009/0176450 A1* | 7/2009 | Chow | .................... | H01L 23/48 |
| | | | | 455/41.1 |
| 2010/0013512 A1* | 1/2010 | Hargan | .................. | H01L 22/22 |
| | | | | 324/762.02 |
| 2011/0309357 A1* | 12/2011 | Tain | ........................ | G01B 7/18 |
| | | | | 257/48 |
| 2012/0110402 A1* | 5/2012 | Wang | ............. | G01B 31/318572 |
| | | | | 714/729 |
| 2012/0112776 A1 | 5/2012 | Cher et al. | | |
| 2013/0047049 A1* | 2/2013 | Chen | ............. | G01B 31/318536 |
| | | | | 714/733 |
| 2013/0271169 A1* | 10/2013 | Colvin | .................... | G01R 1/44 |
| | | | | 324/750.03 |
| 2013/0326294 A1* | 12/2013 | Lo | .......................... | G11C 29/16 |
| | | | | 714/718 |
| 2014/0111242 A1* | 4/2014 | Xie | .................... | G01R 31/2853 |
| | | | | 324/762.02 |
| 2014/0239300 A1* | 8/2014 | Choi | .................. | G01R 31/2875 |
| | | | | 257/48 |

OTHER PUBLICATIONS

Bana, F. et al., "Improved statistical analysis at low failure rates in Cu electromigration using an innovative multilink test structure", IEEE, (2012), 3 pages.

Hauschildt, M. et al., "Large-scale statistical analysis of early failures in Cu electromigration, Part I: Dominating mechanisms", Journal of Applied Physics, 108, (2010), 10 pages.

PCT International Search Report and Written Opinion; PCT/IB2015/059339; dated Mar. 14, 2016.

* cited by examiner

INTEGRATED CIRCUIT DEVICE COMPRISING ENVIRONMENT-HARDENED DIE AND LESS-ENVIRONMENT-HARDENED DIE

BACKGROUND

Technical Field

The present technique relates to the field of integrated circuits.

Background

Recently, new integrated circuit technologies are being developed which allow multiple integrated circuit layers to be stacked in a vertical direction. For example, in three-dimensional (3D) integrated circuits, a number of integrated circuit dice are stacked in a vertical direction. In so-called 2.5D integrated circuits, a number of dice are mounted on an interposer which permits the dice to communicate with each other via the interposer. In traditional two-dimensional integrated circuits, space for wired connections between circuit elements in the horizontal direction is typically at a premium. In 2.5D or 3D circuits, some of this horizontal wiring may be replaced by inter-layer communication in a vertical direction, so that circuit area can be reduced. The present technique seeks to make use of these new technologies.

SUMMARY

Viewed from one aspect, an integrated circuit device comprises:

at least one environment-hardened die comprising environment-hardened circuitry; and at least one less-environment-hardened die comprising less-environment-hardened circuitry, wherein the environment-hardened circuitry is more resistant to degradation when exposed to at least one predetermined environmental condition than the less-environment-hardened circuitry;

wherein:

(i) the integrated circuit device comprises a plurality of vertically stacked dice including the at least one environment-hardened die and the at least one less-environment-hardened die; or (ii) the at least one environment-hardened die and the at least one less-environment-hardened die are mounted on an interposer to provide communication between the at least one environment-hardened die and the at least one less-environment-hardened die.

Viewed from another aspect, an integrated circuit device comprises:

at least one environment-hardened die means for supporting environment-hardened circuit means, and at least one less-environment-hardened die means for supporting less-environment-hardened circuit means, wherein the environment-hardened circuit means is for being more resistant to degradation when exposed to at least one predetermined environmental condition than the less-environment-hardened circuit means;

wherein:

(I) the integrated circuit device comprises a plurality of vertically stacked die means including the at least one environment-hardened die means and the at least one less-environment-hardened die means; or (ii) the at least one environment-hardened die means and the at least one less-environment-hardened die means are mounted on interposer means for allowing communication between the at least one environment-hardened die means and the at least one less-environment-hardened die means.

Another aspect provides a method of testing a test subject circuit when exposed to at least one predetermined environmental condition; the method comprising:

providing an integrated circuit device comprising at least one environment-hardened die comprising a testing circuit and at least one less-environment-hardened die comprising the test subject circuit, wherein the testing circuit on the at least one environment-hardened die is more resistant to degradation when exposed to said at least one predetermined environmental condition than the test subject circuit on the at least one less-environment-hardened die, wherein (I) the integrated circuit device comprises a plurality of vertically stacked dice including the at least one environment-hardened die and the at least one less-environment-hardened die; or (ii) the at least one environment-hardened die and the at least one less-environment-hardened die are mounted on an interposer to provide communication between the at least one environment-hardened die and the at least one less-environment-hardened die;

performing a test operation on the test subject circuit using the testing circuit on the at least one environment-hardened die, while exposing the test subject circuit to said at least one predetermined environmental condition; and capturing or outputting at least one test measurement obtained during the test operation using the testing circuit on the at least one environment-hardened die.

The above, and other objects, features and advantages of this invention will be apparent from the following detailed description of illustrative embodiments which is to be read in connection with the accompanying drawings.

DESCRIPTION OF EXAMPLE EMBODIMENTS

Figure 1A:
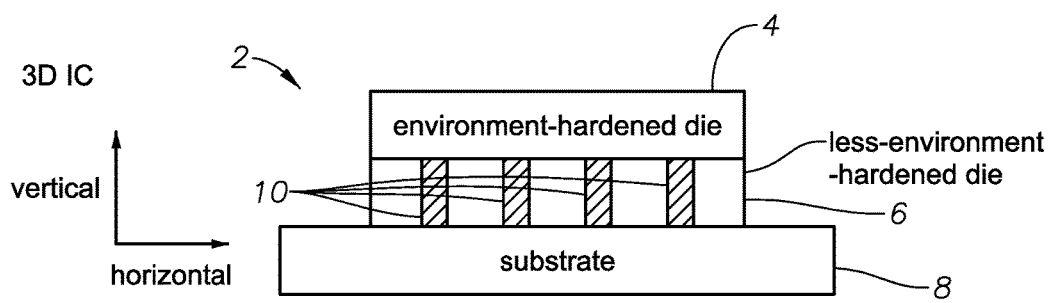
FIGS. 1A to 1C illustrate examples of a 3D integrated circuit comprising at least one environment-hardened die and at least one less-environment-hardened die.

An integrated circuit device may comprise at least one environment-hardened die comprising environment-hardened circuitry and at least one less environment-hardened die comprising less-environment-hardened circuitry, where the environment-hardened circuitry is more resistant to degradation when exposed to at least one pre determined environmental condition than the less environment-hardened circuitry. The environment-hardened and less-environment-hardened dice may be combined using 3D or 2.5D technology. For example, the integrated circuit device may have a number of vertically stacked dice including the at least one environment-hardened die and the at least one less-environment-hardened die (e.g. a 3D integrated circuit). In another example, the dice may be mounted on an interposer to provide communication between the at least one environment-hardened die and the at least one less-environment-hardened die (for example, using 2.5D integrated circuit technology).

This approach provides significant benefits for devices which are expected to operate in adverse environmental conditions (such as high temperature for example), or for testing devices at such conditions. The respective dies can be constructed from different semiconductor technologies so that one die is more resistant to degradation at the targeted environmental condition than another. The environment-hardened die may provide the environment-critical functionality which needs to operate at the desired environmental condition while the less-environment-hardened die can include other functionality which does not need to be functional at that condition.

This approach may be particularly useful for testing for reliability of integrated circuits, since the environment-hardened die may provide a testing circuit for testing a test subject circuit provided on the less-environment-hardened die, so that the testing circuit may remain functional while the device as a whole is exposed to the predetermined environmental condition for testing. For example, the testing may test degradation of the test subject circuit due to one or more of electromigration, time dependent dielectric breakdown, bias temperature instability, or hot carrier injection, ambient radiation, or electrical stress, which may often be dependent on environmental conditions of the device.

In one example the test subject circuit may comprise a number of devices under test (DUTs). For example, each DUT may comprise a wire, a transistor, a logic gate, a collection of transistors or logic gates, or a more complex circuit. The testing circuit may comprise a selector circuit for selecting which of the DUTs are to be tested at a given time. This is very useful because typically the number of input pins that can be provided on the die is being tested is limited.

For example, the device used to generate the environmental condition to be tested may limit the number of connections that can be made to the test die—e.g. ovens for baking circuits to high temperatures may only have room for a certain number of wires to interface with the test circuit. The number of external pins required could be reduced by providing selection circuitry on the test subject die to expand the signals input from outside into signals selecting individual DUTs for testing. However, when testing at adverse environmental conditions, the selection circuitry itself could fail, preventing proper testing of the DUTs themselves. Hence, existing tests at adverse environmental conditions have typically been limited to selecting each DUT individually with signals provided from the outside, hence limiting the total number of DUTs that can be tested on a single test die.

By providing a selector circuit on a separate environment-hardened die which is coupled with the test subject die using 3D or 2.5D technology, the selector circuit may continue to function even when the test subject circuit starts to fail. For example, the selector circuit may comprise an addressable array which selects one or more DUTs for testing in response to an address input from outside, or a scan chain which responds to a given input signal by selecting the DUTs to be tested in a predetermined sequence. This allows relatively few input signals to be used to select a larger number of DUTs for testing, so that the limit to the number of external inputs does not impact on the number of DUTs which can be tested. Increasing the number of DUTs that can be tested on a single test chip has several advantages—firstly, the increased sample size brings more statistically valid results, and secondly the cost per DUT can be reduced.

In other examples the test circuit on the environmentally-hardened die may apply a more complicated test algorithm than simply inputting some signals to test a physical breakdown effect. For example, the test circuit may comprise a built in self test (BIST) circuit which may run various test algorithms on the test subject circuit located on the less-environment-hardened die. For example, the test subject circuit may comprise a processor, a memory, system-on-chip, or other relatively complex circuit, and the BIST circuit may perform various operations to test whether the test subject circuit responds appropriately to applied stimuli. For example, a memory BIST circuit may perform various read and write operations on a memory to test whether the memory is functioning correctly. Typical BIST implementations are not appropriate for testing at adverse environmental conditions, since the BIST circuit may itself fail at these conditions, preventing proper testing of the test subject circuit. By providing the BIST circuit on the environmentally-hardened die, the test subject circuit can be tested more thoroughly over a wider range of environmental conditions, to gain increased information about the reliability of the test subject circuit.

In some examples, at least one local heating element may be provided for local heating of a corresponding region of the test subject circuit. The local heaters are useful for stressing the test subject circuit in ways that would not be possible with a global heater which heats the entire circuit. For example, the local heaters may replicate conditions which may arise within the test subject circuit if only some components of the test subject circuit are active. While the local heating elements may be provided on the less-environment-hardened die, it can be particularly useful to provide them on the environment-hardened die, to allow for greater heating (to achieve greater heating, the local heating elements may require a higher voltage or power than can be withstood by the circuitry on the less-environment-hardened die). Alternatively, the local heating elements may be on another die which is separate from both the environment-hardened and less-environment-hardened dice. In some cases the heat from the heating elements may conduct through to the less-environment-hardened die through natural heat conduction. However, with a 3D integrated circuit, more efficient heat conduction may be achieved by through silicon vias (TSVs) extending vertically through one or more of the stacked layers, to conduct heat between the local heating element and the corresponding region of the test subject circuit.

3D or 2.5D integrated circuits with environment-hardened and less-environment-hardened dies may also be useful for devices expected to operate at adverse conditions. For example, wireless sensor nodes or Internet of Things (IoT) devices may often operate in the field under relatively unfavourable conditions, such as high/low temperatures, high humidity, high acidity, or high radiation levels. For example, a sensor in an oil well may need to withstand high temperatures, a sensor in space may need to withstand high radiation levels, etc. While the entire device could be made of environment-hardened devices (e.g. using high-temperature semiconductors), this may be relatively expensive compared to less environment-hardened devices. Often, only some of the functionality of the device would need to remain functional at the adverse conditions. For example, with the oil well example, a sensor placed on a drill may only need to capture and/or store sensor data when down the oil well, but the processing of the sensor data and/or communication of the sensor data to other devices may wait until the sensor has been extracted from the oil well. Hence, by providing elements such as a data sensor and memory on the environment-hardened die of the 2.5D/3D integrated circuit, and the processing circuitry or communication circuitry on the less-environment-hardened die, the cost of the device can be brought down while providing improved area efficiency compared to 2D integrated circuits.

The environment-hardened die may be any device which has increased resistance to degradation at a given environment condition than the less-environment-hardened die. For example, the predetermined environmental condition may comprise at least one of the following: temperatures higher than a temperature threshold, temperatures lower than a temperature threshold, humidity higher than a humidity threshold, increased acidity (pH lower than a certain threshold), level of ambient radiation higher than a certain threshold, or electrical stress such as over-voltage. Semiconductor technologies are available which provide increased resistance to breakdown under these conditions. For example, for high-temperature operation, devices comprising silicon carbide or gallium nitride may be used. Alternatively, rather than using a different semiconductor technology, the environment-hardened die may have a circuit design which builds in more protection against degradation at the desired condition than the less-environment-hardened die. For example, the environment-hardened die may include some redundancy to guard against certain elements failing at the predetermined environmental condition.

For a 3D integrated circuit, the vertically stacked dice may communicate with each other in different ways. For example, through silicon vias may extend partially or fully through at least some of the dice. Alternatively, wire bonds may be passed between the stacked layers. Also, some examples may use wireless communication between the stacked dice, e.g. using radio communication. Similarly, in the 2.5D integrated circuit, the respective dice may communicate with the silicon interposer by any of these techniques.

Figure 1B:
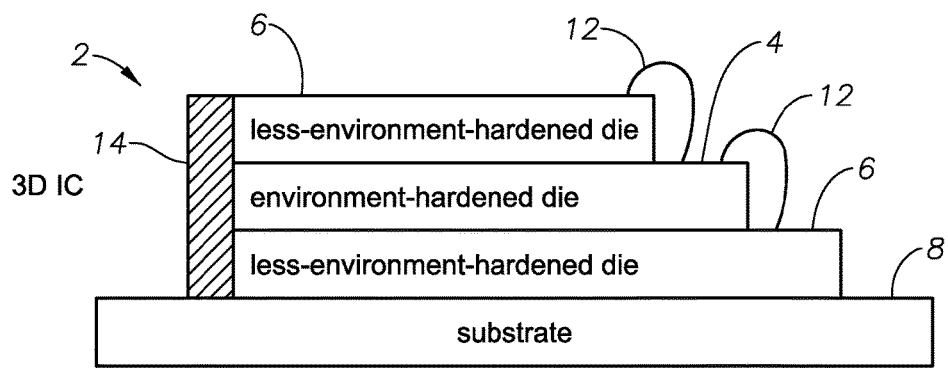
Figure 1C:
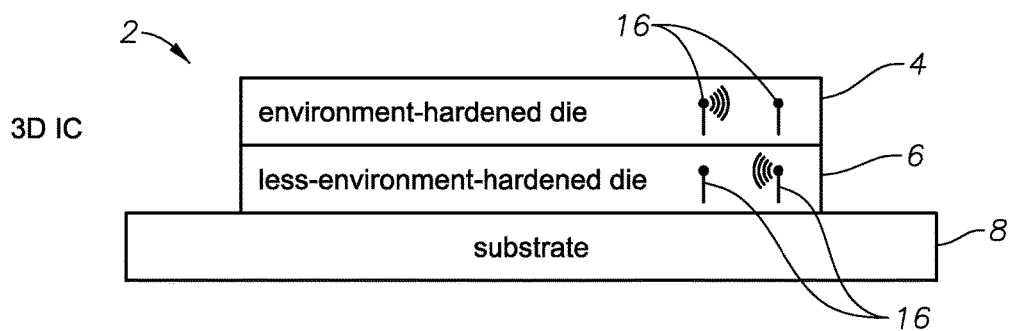

FIGS. 1A to 1C illustrate three examples of 3D integrated circuit devices 2 including at least one environment-hardened die 4 and at least one less-environment-hardened die 6. The environment-hardened die 4 is more resistant to degradation (either physical degradation or functional degradation) at a particular environmental condition than the less-environment-hardened die 6. In each of examples in FIGS. 1A to 1C, the dice 4,6 are part of a stacked set of dice mounted on top of each other in a vertical direction on a substrate 8 (the vertical direction is perpendicular to the plane of the substrate 8, as opposed to the horizontal direction which is parallel to the plane of the substrate 8). Some examples may have more than one environment-hardened die 4 or more than one less environment-hardened die 6 (e.g. see FIG. 1B). Some examples may also include one or more dies other than the environment-hardened die 4 and less-environment-hardened die 6.

FIGS. 1A to 1C show different communication techniques for communicating between the stacked dice. In FIG. 1A, the lower die 6 has through silicon vias (TSVs) 10 extending through it to allow the upper die 4 to communicate with the lower die 6 and the substrate 8. In other examples, the TSVs may not extend fully through the lower die 6 and instead may stop part-way into the die 6. Also, the TSVs could extend (partially or fully) into die 4 as well. Also, in some instances there may not be a die with TSVs at all. Die 4 could be married with die 6 and placed directly on a printed circuit board. Also, in some cases there may be an additional bump layer between the TSV 10 and the chip 4.

Figure 2:
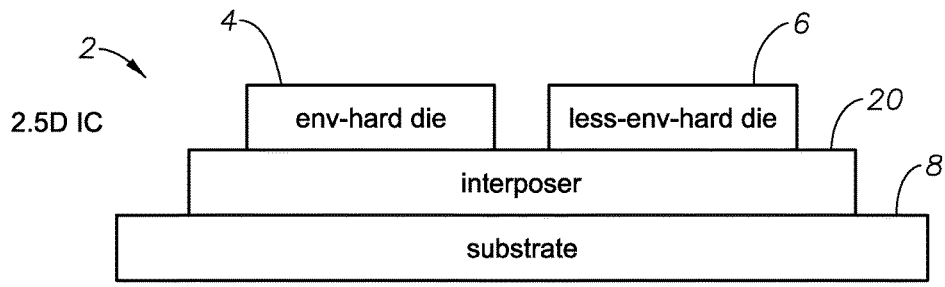
FIG. 2 illustrates an example of a 2.5D integrated circuit in which environment-hardened and less-environment-hardened dies are mounted on an interposer.

In FIG. 1B, wire bonds 12 extending between adjacent dice link an upper die to a portion of the lower die which extends beyond the upper die. Alternatively, a metal wiring layer 14 may extend up the side of the dice. In the example of FIG. 1C, the dice include a number of wireless communication elements 16 which may communicate with each other by radio waves, with frequency modulation for example to prevent cross talk between different local transmitters 16. FIG. 2 shows an example of 2.5D integrated circuit technology in which the environment-hardened and less-environment-hardened dice 4, 6 are mounted on a silicon interposer 20 which is in turn mounted on the substrate 8. The interposer 20 may comprise a circuit which includes connections which connect parts of die 4 to corresponding parts of die 6. It will be appreciated that other forms of 3D or 2.5D integrated circuit technology may also be used, and that the integrated circuit may also include many other types of layer not shown in the drawings for conciseness.

Figure 3:
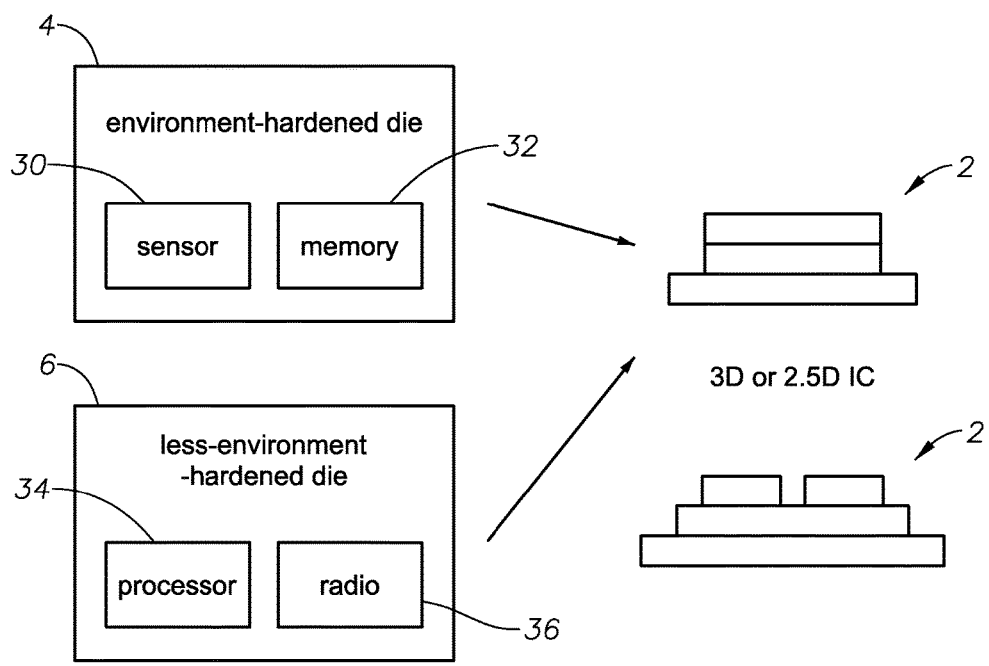
FIG. 3 illustrates a first example of a 3D or 2.5D integrated circuit in which the environment-hardened-die includes circuitry for capturing or storing sensor data and the less environment-hardened die includes circuitry for processing or communicating the data.

FIG. 3 shows an example in which the environment-hardened die 4 includes a sensor 30 for capturing sensing data, such as a temperature sensor for example, and a memory 32 for storing the captured sensing data. The less-environment-hardened die 6 includes a processor 34 for processing the sensing data stored in the memory 32 and a radio unit 36 for transmitting the raw or processed sensing data to an external device. The environment-hardened die 4 and less-environment-hardened die 6 are combined to form a 3D or 2.5D integrated circuit as in the earlier examples. This approach is useful for a wireless sensor node which may operate at adverse conditions such as high temperatures. When at the adverse operating condition, the environment-hardened die 4 can continue to operate to capture and store the sensing data. It may not be essential for the processing and communication functions provided by the less-environment-hardened die to be active while in the adverse environment conditions and so this can be constructed more cheaply using less-environment-hardened-devices. Once the device returns from the adverse environmental condition then the sensing data can be processed or the data communicated with another device. Other examples may implement other types of circuitry on the respective dice 4, 6, depending on which functions need to operate at the desired environmental condition.

Figure 4:
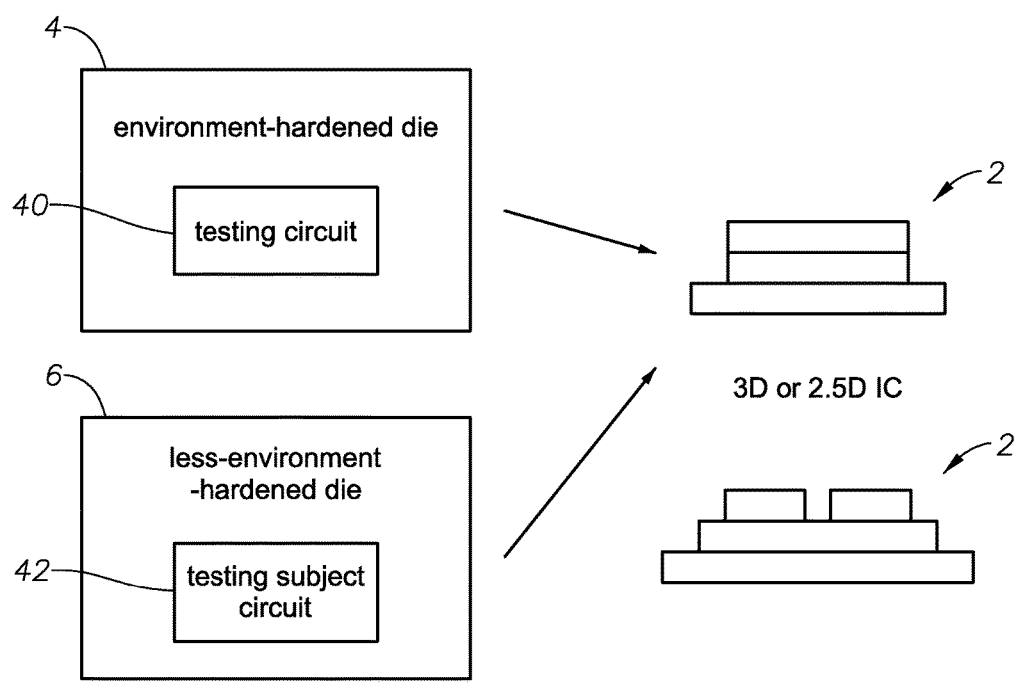
FIG. 4 show an example in which the environment-hardened die includes a testing circuit and a less-environment-hardened die includes a test subject circuit.

FIG. 4 shows another example in which the environment-hardened die 4 includes a testing circuit 40 and the less-environment-hardened die 6 include a test subject circuit 42 for being tested by the testing circuit 40. The dice 4, 6 are again combined to form a 3D or 2.5D integrated circuit, using any known 3D or 2.5D integrated circuit technology. This approach is very useful since it allows the test subject circuit to be tested at environmental conditions without the testing circuit degrading.

Figure 5:
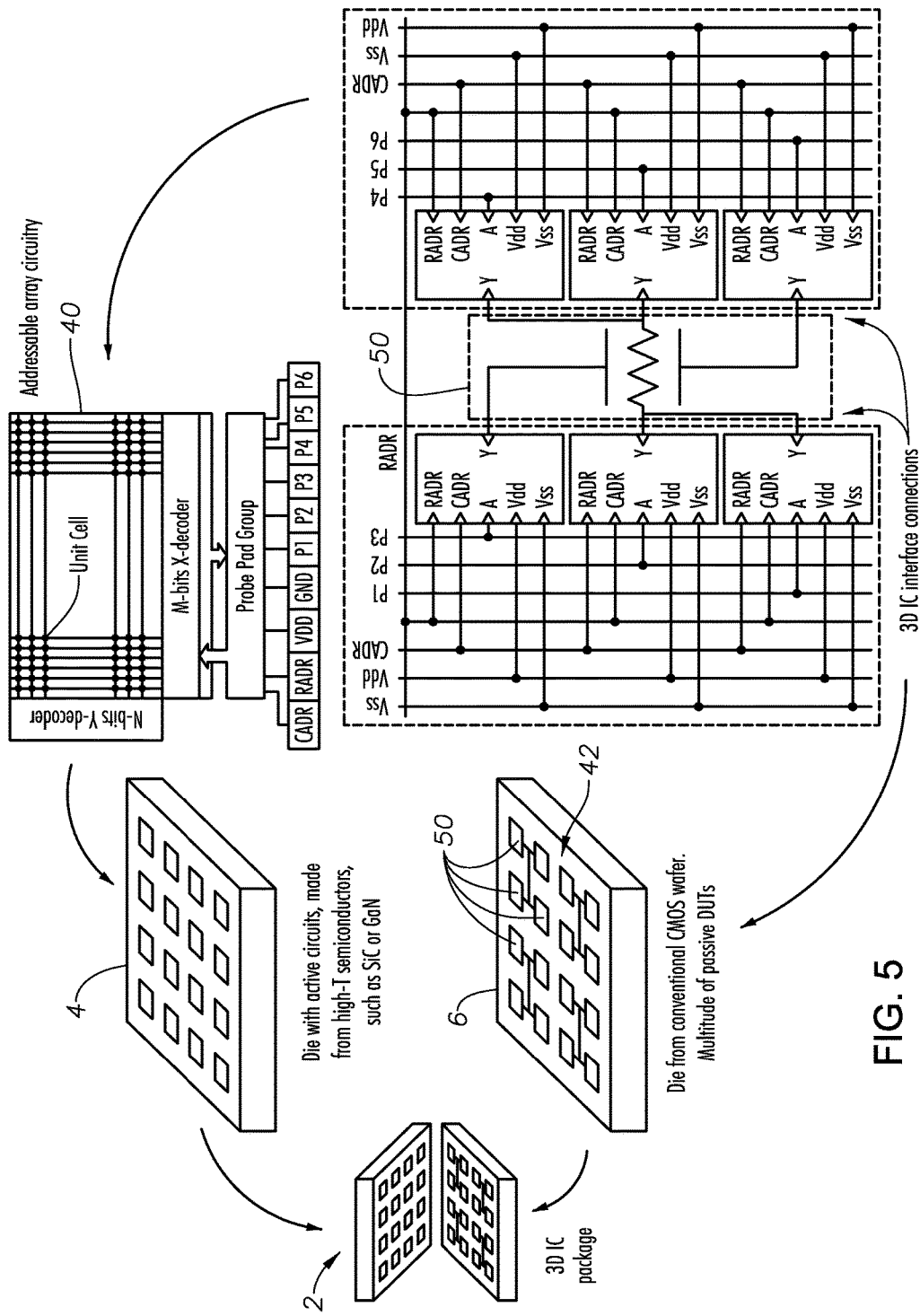
FIG. 5 shows an example of testing for electromigration at high temperatures, where the environment-hardened die includes an addressable array for selecting devices under test on the less-environment-hardened die.

FIG. 5 shows a more detailed example of a 3D integrated circuit comprising an environment-hardened die 4 with a test circuit 40 and a less environment-hardened die 6 with a test subject circuit 42. It will be appreciated that the same circuitry could be implemented in a 2.5D integrated circuit. For example, this approach may be used to connect a die 4 to test at high temperature with a die 6 made from high-temperature semiconductor devices, such as Silicon Carbide (SiC) or Gallium Nitride (GaN), to facilitate improvements in high temperature testing. This particular example is for electromigration testing. Electromigration (EM) testing is performed at accelerated temperature and current in order to create failures in a reasonable time. The temperatures used (250-350 degrees C.) are well beyond the capability of conventional CMOS devices, so the conventional EM testing is limited to passive Devices Under Test (DUTs), typically simple wires connected to external pins. A compounding problem is that the high temperature testing is performed in design ovens that have a limited channel count (dozens). Wafer level EM test methods do exist, but in the reliability community these are regarded as not accurate and are not used in any true foundry EM assessment. The EM DUTs themselves typically require very accurate resistance measurement, so they are tested in Kelvin mode, meaning 4 leads per tested device, two leads to apply a current to the DUT and two leads to measure a voltage. Actually, including extrusion monitoring, at least 5 leads per DUT are required. For example, FIG. 5 shows an example where each DUT 50 uses six input leads P1 to P6. Due to these limitations, the typical EM test is limited to dozens of Devices Under Test (DUTs), and thus the statistical visibility is limited to around 1% failure rate, which is concerning when the chips may contain more than a billion interconnect wires. It is particularly concerning because EM, like many reliability mechanisms, is a statistical problem, relating in part to the random distribution of grain boundaries in the film, which are the weak points for EM failure. Further concerning is that some authors have proposed that different failure modes occur in the early, low-probability tails of the failure distributions. Hence, it is desirable to increase the number of DUTs 50 that can be tested at a time on a given test chip. An additional advantage of testing a larger number of devices at once is that statistically significant failure rates could be measured at lower temperatures in a given time. This allows lower temperature testing (still high enough to prevent the use of on-chip solutions), and hence a more accurate extrapolation back to normal operating conditions. Specifically regarding EM, there is concern that several different mechanisms are at work at the same time, each with different activation energies, so the extrapolation back from high temperatures done with typical test methods is possibly wrong, and extra guard-banding ensues.

In order to test more devices at a time, the test circuit 40 on the environment-hardened die 4 may be used as a selector for selecting individual DUTs 50 or groups of DUTs 50 on the less-environment-hardened die 6 for testing. For example, FIG. 5 shows an example where the test circuit 40 comprises an addressable array so that the voltage sense signals for a large number of DUTs could be multiplexed to the small number of board signal pins. The board pins can simply input a row address and column address and the input signals P1-P6, and the addressable array can then map the row/column addresses to the appropriate unit cell and then route the input signals P1-P6 to the corresponding DUTs 50 on the other die 6 using one of the communication methods discussed above. Another example may use a scan chain or other circuit for selecting individual DUTs to be tested, instead of the addressable array. In general, such a selector circuit cannot be formed on-chip on die 6, because the CMOS devices will fail at the high testing temperatures. However, we can utilize 3D or 2.5D integrated circuit (IC) technology to marry a set of passive DUTs with an addressable array on die 4 constructed out of high temperature superconductors. Commercial foundry services are now available in several high temperature device materials, including Silicon Carbide and Gallium Nitride. The "3D" technology to be used is not important—it could be actual 3D, such as using Through Silicon Vias, or 2.5D using interposers. Both of these technologies are now commercially available at many foundries and packaging houses. We do not need a high density of interconnects in order to achieve a significant improvement in the testable DUTs/board, so standard available 3D/2.5D IC technologies will be sufficient.

This arrangement can be directly applied to other reliability mechanisms that are accelerated with high temperature, such as Time Dependent Dielectric Breakdown (TDDB), Bias Temperature Instability (BTI), Hot Carrier Injection (HCI), etc.

Because traditional EM testing already involves packaging and long-term testing of small sample sizes in dedicated ovens, the additional cost of specialty 3D packaging will not be particularly high. Furthermore, the number of DUTs per oven (limited by oven lead count) can be greatly increased with additional circuitry placed on the environment-hardened die. Examples would include current sources, voltage sensors, and/or analogue-to-digital conversion (ADC) of the sensed voltages. The solution discussed above may also exhibit a compelling cost advantage over the conventional reliability oven approach This concept could also be applied to several other areas. It could be applied to low temperature testing, or testing in adverse environments such as high humidity, acidity, etc., using other specialized semiconductor processes geared toward low temperature operation. These applications could be especially valuable to Internet of Things applications or in wireless sensor networks, which can often include harsh environments. The method could also be applied to single-event upset testing (particle strike errors), marrying a test die to a radiation-hard die. Additional applications could be to generate local noise signatures.

Figure 6:
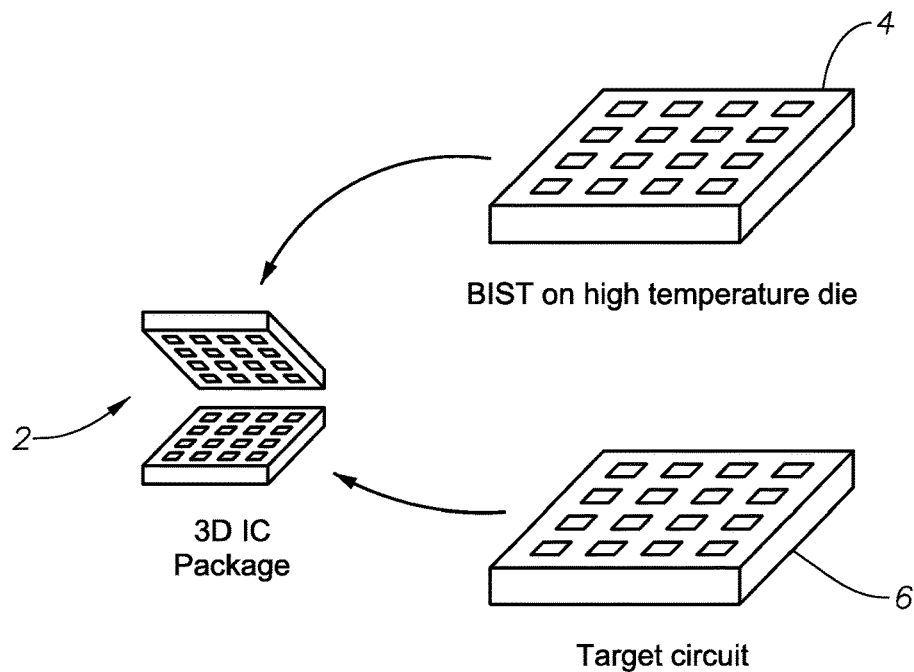
FIG. 6 illustrates an example where the environment-hardened die includes a built in self test (BIST) circuit for applying a test algorithm to a target circuit.

Beyond the testing of passive reliability DUTs, this concept may be extended to test full circuits, including cores or SoC, as the "chip under test", as shown in FIG. 6 for example. In this case, a BIST circuit may be created in the environment-hardened process/die 4, and then this may be married to the chip under test 6 using 2.5/3D techniques. This method allows thorough testing of the upper limits of temperature on the target chip, at speed, without the concern of having a conventional on-chip BIST circuit fail first and thus not having visibility into exactly what failed and how. This application may allow for the certification of larger windows of temperature operation simply by direct observation/characterization, but it also may allow for enhanced learning of high temperature failure mechanisms leading to design changes that facilitate higher temperature operation. This case is particularly valuable in advanced process nodes where thermal concerns begin to limit peak performance, and the exact limiting factors of thermal reliability in multi-core systems are not well understood.

Figure 7:
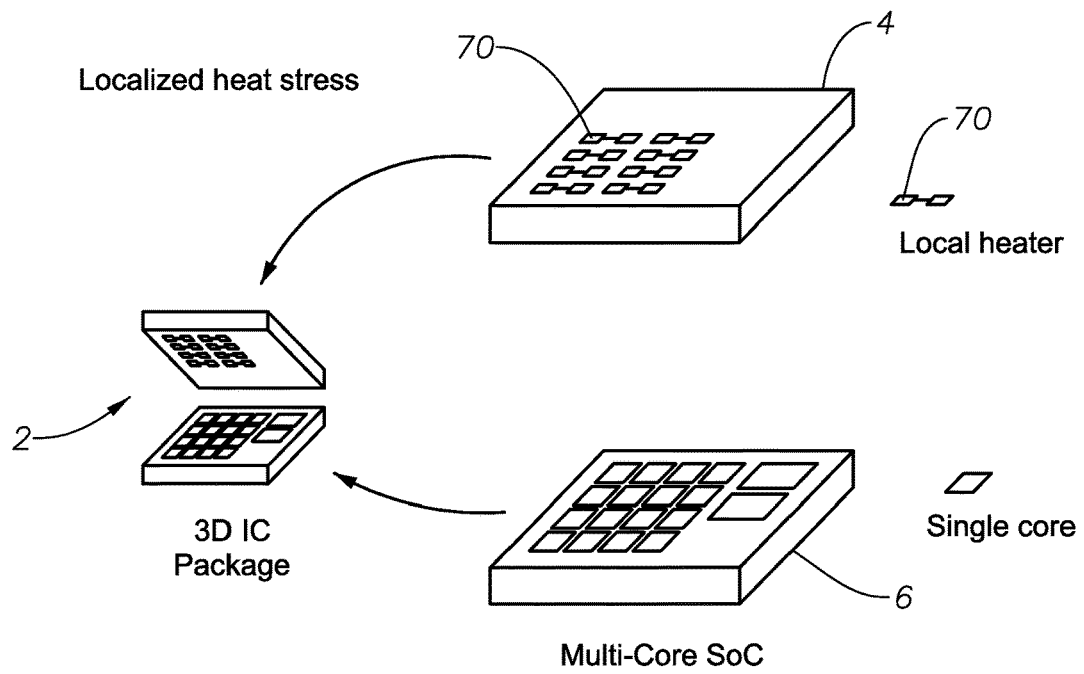
FIG. 7 shows an example in which the environment-hardened die includes local heating elements for heating corresponding regions of the less-environment-hardened die.

There are also potential hybrid applications, incorporating specialized reliability testing and BIST. As shown in FIG. 7, one option is to use the environment-hardened (e.g. high temperature) die 4 to create localized heating and also stress the chip under test. Hence, the die 4 may include local heating elements 70 which heat corresponding areas of the less-environment-hardened die 6. For example, an addressable array as in FIG. 5 may be used to select which local heating elements 70 are active. Providing local heaters allows us to stress the SoC on die 6 in ways that have not been possible before. Other solutions include adding local heater features to the target circuit directly, but this is by definition a test chip and not truly product representative.

The local heaters may be created in several ways:
1. Simply contained on the BIST chip 4 and the natural heat conduction could be used through a direct-face bonding or through an interposer.
2. In the example of a through silicon via (TSV) technology, dedicated TSVs could be used to more efficiently conduct the heat down to the chip 6 under test (less-environment-hardened die) from the BIST chip 4 (environment-hardened die).
3. It is also possible that features could be created on the test chip 6 to act as the actual heaters, connected up to the BIST chip 4 through the 3D interconnect. This option is similar to the existing technologies noted, but the fact that the BIST chip is made from high temperature semiconductor devices is an advantage, because they are typically very high voltage/high power devices, and thus heating through upper layer metal wires could be more practical than with standard CMOS drivers. Also, if the heaters are limited to upper layers of metallization on the target chip, the differences between test chip and product chip could be minimized.
4. Another potential advantage of combining high temperature (high power) semiconductors and 3DIC-based test is that these devices may be able to heat locally through RF means. Gallium nitride semiconductor devices, for instance, are leading candidates to replace magnetrons in microwave ovens. The RF capabilities in the testing devices may also enable noise generation and testing.

In some timing critical BIST implementations, care may be taken in the design of the BIST structure to compensate for the natural temperature dependence of the high temperature devices, in order to engineer a BIST circuit that is as temperature-independent as possible. The temperature dependence of the 3D interconnections may also need to be considered in this type of design.

It is not necessary to limit this concept to two dice 4, 6. The test system could be composed of more than one chip. For instance it could be composed of a heater layer and a BIST layer 6, and the target chip layer 4 may be on the bottom, top, or middle of this 3-chip arrangement. Additionally, the technique is not limited to one test subject die 6 and one testing die 4. It could be advantageous to extend this to one to many, or many to one.

While it is possible that temperature sensors on the BIST die 4, connected through TSV wires, can be made to sufficient accuracy, local temperature sensors added to the target chip 6 may be beneficial. It is anticipated that the incorporation of local temperature sensors will increase in product die anyway, and therefore this option may not force a difference between the test chip implementation and the product implementation.

There are many variables at work in cost assessment. In standard reliability testing, taking the EM example, a small group of die are packaged, each with one or two devices under test. Because the simple EM test structures can be made to a common pin configuration, the cost does not increase if one wishes to test different test structures. This same paradigm can exist with this 3DIC technique: If different test die conform to the same pin configuration, all can use the same manufactured BIST die, and cost is not increased. However, in extension to some of the more complex SoC test implementations that have been discussed, changing to a different die-under-test might require at least one mask-level change if different die cannot conform to the same pin configuration. Thus, a cost mitigation option for this technique includes designing the BIST die so that the re-design of a minimum number of masks can allow re-configuration to multiple tested die configurations. (if a common pin configuration is not practical). This would be in conjunction with banking wafers in the fab, such as for via ROM programming. Accordingly, one simple option in this case would be to define a common grid of connections between die, then use a last-via-programming design technique on the BIST die to correctly marry test pins. Another factor in cost comparison is that the minimum unit of manufactured test die will be much larger than the minimum unit of conventional packaging, and the fixed costs will be also much higher (owing to extra mask layers and the 3DIC process itself). This is an important consideration in the full chip testing paradigm, and may be mitigated by a 1:many testing configuration. For the simpler examples of passive device testing, any increase in cost with this proposal should be more than compensated by the orders-of-magnitude increase in sample size afforded by the technique.

Figure 8:
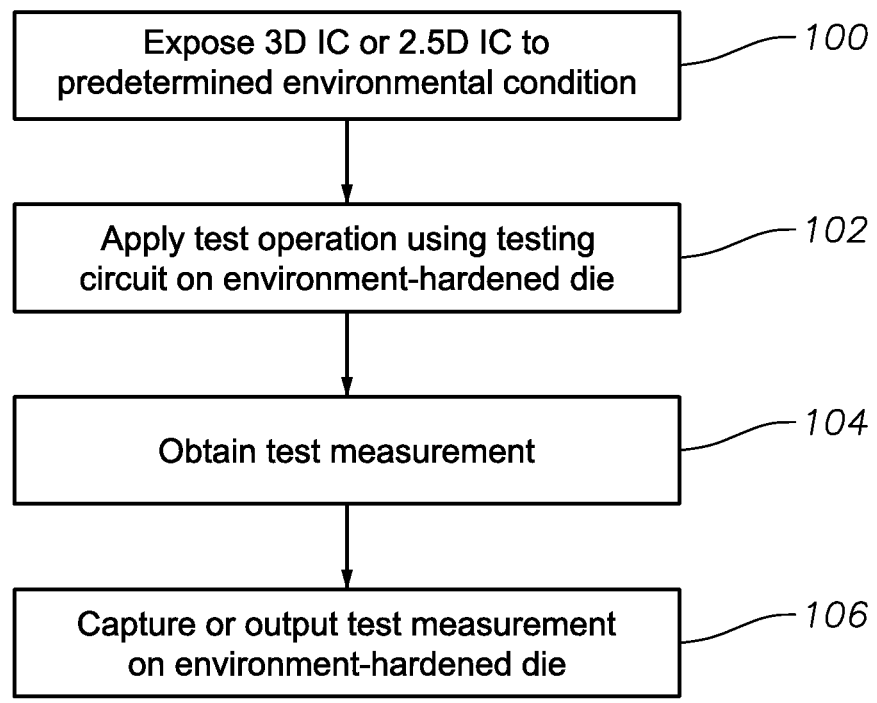
FIG. 8 is a flow diagram illustrating a method of testing.

FIG. 8 is a flow diagram showing a method of testing a test subject circuit at a predetermined environmental condition. At step 100 the 3D/2.5D integrated circuit is exposed to the environmental condition. At step 102 the testing circuit 40 applies a test operation or procedure. At step 104 a test measurement is obtained. At step 106 the test measurement is captured and/or output using the testing circuit 40 on the environment-hardened die.

The terms "dice", "dies" and "die" may all be used for the plural of "die".

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:
1. An integrated circuit device comprising:
   at least one environment-hardened die comprising environment-hardened circuitry formed of a first material; and
   at least one less-environment-hardened die comprising less-environment-hardened circuitry formed of a second material that is different than the first material,
   wherein the first material of the environment-hardened circuitry is more resistant to degradation when exposed to at least one predetermined environmental condition than the second material of the less-environment-hardened circuitry,
   wherein the integrated circuit device comprises a plurality of vertically stacked dice including the at least one environment-hardened die and the at least one less-environment-hardened die, and wherein communication between the plurality of vertically stacked dice is provided by wireless communication directly between adjacent dice of the plurality of vertically stacked dice using transmitters and radio waves with frequency modulation to inhibit cross talk between the transmitters.

2. The integrated circuit device according to claim 1, wherein the integrated circuit device comprises a 3D integrated circuit comprising said plurality of vertically stacked dice.

3. The integrated circuit device according to claim 1, wherein the less-environment-hardened circuitry comprises a test subject circuit and the environment-hardened circuitry comprises a testing circuit to perform testing of the test subject circuit.

4. The integrated circuit device according to claim 3, wherein the testing comprises reliability testing for testing degradation of the test subject circuit when exposed to said at least one predetermined environmental condition.

5. The integrated circuit device according to claim 4, wherein the reliability testing is for testing degradation of the test subject circuit due to at least one of:
  electromigration;
  time dependent dielectric breakdown;
  bias temperature instability;
  hot carrier injection;
  electrical stress; and
  ambient radiation.

6. The integrated circuit device according to claim 3, wherein the test subject circuit comprises a plurality of devices under test (DUTs), and the testing circuit comprises a selector circuit to select one or more of the DUTs to be tested.

7. The integrated circuit device according to claim 6, wherein the selector circuit comprises an addressable array to select said one or more of the DUTs to be tested in response to at least one address input to the selector circuit.

8. The integrated circuit device according to claim 6, wherein the selector circuit comprises a scan chain to select the DUTs to be tested in a predetermined sequence.

9. The integrated circuit device according to claim 3, wherein the testing circuit comprises a built-in self-test (BIST) circuit to perform a predetermined test algorithm on the test subject circuit.

10. The integrated circuit device according to claim 3, comprising at least one local heating element to locally heat a corresponding region of the test subject circuit.

11. The integrated circuit device according to claim 10, wherein the at least one local heating element is provided on one of said at least one environment-hardened die.

12. The integrated circuit device according to claim 11, wherein the integrated circuit device comprises said plurality of vertically stacked dice, and at least one of said vertically stacked dice comprises at least one through silicon via to provide thermal conduction between the at least one local heating element and said corresponding region of the test subject circuit.

13. The integrated circuit device according to claim 1, wherein the environment-hardened circuitry comprises circuitry to capture or store sensing data sensed when the integrated circuit device is exposed to said at least one predetermined environmental condition; and
  the less-environment-hardened circuitry comprises circuitry to process the sensing data or communicate the sensing data to another device.

14. The integrated circuit device according to claim 1, wherein the at least one predetermined environmental condition comprises at least one of:
  high temperature;
  low temperature;
  high humidity;
  high acidity;
  high levels of ambient radiation; and
  electrical stress.

15. The integrated circuit device according to claim 1, wherein the environment-hardened circuitry includes first devices formed of the first material, wherein the less-environment-hardened circuitry includes second devices formed of the second material, and wherein the first devices that are formed with the first material are capable of withstanding temperatures greater than the second devices that are formed with the second material.

16. The integrated circuit device according to claim 15, wherein the first material of the first devices comprises silicon carbide or gallium nitride.

17. A method of testing a test subject circuit when exposed to at least one predetermined environmental condition, the method comprising:
  providing an integrated circuit device comprising at least one environment-hardened die comprising a testing circuit formed of a first material and at least one less-environment-hardened die comprising the test subject circuit formed of a second material that is different than the first material, wherein due to the first material, the testing circuit on the at least one environment-hardened die is more resistant to degradation when exposed to said at least one predetermined environmental condition than the test subject circuit on the at least one less-environment-hardened die, wherein the integrated circuit device comprises a plurality of vertically stacked dice including the at least one environment-hardened die and the at least one less-environment-hardened die;
  providing wireless communication directly between adjacent dice of the plurality of vertically stacked dice using transmitters and radio waves with frequency modulation to inhibit cross talk between the transmitters;
  performing a test operation on the test subject circuit using the testing circuit on the at least one environment-hardened die, while exposing the test subject circuit to said at least one predetermined environmental condition; and
  capturing or outputting at least one test measurement obtained during the test operation using the testing circuit on the at least one environment-hardened die.

18. An integrated circuit device comprising:
  at least one environment-hardened die comprising environment-hardened circuitry formed of a first material; and
  at least one less-environment-hardened die comprising less-environment-hardened circuitry formed of a second material that is different than the first material,
  wherein the first material of the environment-hardened circuitry is more resistant to degradation when exposed to at least one predetermined environmental condition than the second material of the less-environment-hardened circuitry, and
  wherein communication between the at least one environment-hardened die and the at least one less-environment-hardened die is provided by wireless communication directly between adjacent dice using transmitters and radio waves with frequency modulation to inhibit cross talk between the transmitters.

19. The integrated circuit device according to claim 18, wherein the integrated circuit device comprises a plurality of vertically stacked dice including the at least one environment-hardened die and the at least one less-environment-hardened die.

* * * * *